United States Patent [19]
Stellrecht

[11] Patent Number: 5,963,778
[45] Date of Patent: Oct. 5, 1999

[54] METHOD FOR PRODUCING NEAR NET SHAPE PLANAR SPUTTERING TARGETS AND AN INTERMEDIATE THEREFOR

[75] Inventor: David E. Stellrecht, Camano Island, Wash.

[73] Assignee: Tosoh SMD, Inc.

[21] Appl. No.: 09/125,955

[22] PCT Filed: Feb. 13, 1997

[86] PCT No.: PCT/US97/02060

§ 371 Date: Aug. 26, 1998

§ 102(e) Date: Aug. 26, 1998

[87] PCT Pub. No.: WO97/31739

PCT Pub. Date: Sep. 4, 1997

[51] Int. Cl.[6] ............................ B22F 3/12; B22F 3/14; B22F 7/04

[52] U.S. Cl. .................. 428/554; 428/557; 419/8; 419/49

[58] Field of Search .................. 419/8, 49; 428/554, 428/557

[56] References Cited

U.S. PATENT DOCUMENTS

| | | | |
|---|---|---|---|
| 4,673,549 | 6/1987 | Ecer | 419/10 |
| 5,118,661 | 6/1992 | Maeda | 505/1 |
| 5,160,534 | 11/1992 | Hiraki | 75/248 |
| 5,160,675 | 11/1992 | Iwamoto et al. | 264/56 |
| 5,215,639 | 6/1993 | Boys | 204/192.12 |
| 5,230,459 | 7/1993 | Mueller et al. | 228/164 |
| 5,234,487 | 8/1993 | Wickersham, Jr. et al. | 75/248 |
| 5,294,321 | 3/1994 | Satou et al. | 204/298.13 |
| 5,342,571 | 8/1994 | Dittmar et al. | 419/13 |
| 5,392,981 | 2/1995 | Makowiecki et al. | 228/122.1 |
| 5,397,050 | 3/1995 | Mueller | 228/193 |
| 5,435,965 | 7/1995 | Mashima et al. | 419/8 |
| 5,522,976 | 6/1996 | Campet et al. | 204/298.13 |
| 5,626,920 | 5/1997 | Weir et al. | 427/530 |

*Primary Examiner*—Daniel J. Jenkins
*Attorney, Agent, or Firm*—Biebel & French

[57] ABSTRACT

A preferred method for producing a pair of sputter targets includes the step of machining fist and second backing plates to form surfaces having near net profiles characteristic of an ion source, the sputtering material and the target shape. A preform is constructed which includes the first backing plate, a first powder layer abutting against the first backing plate, a spacer abutting against the first powder layer, a second powder layer abutting against the spacer, and the second backing plate abutting against the second powder layer. In an especially preferred form, the spacer comprises a pair of metal plates separated by a layer of bond-resistant material such as boron nitride. The preform is heated and isostatically pressed to consolidate the powder layers to form the pair of sputter targets and to diffusion bond the targets to corresponding backing plates. The method promotes the formation of uniformly even sputtering surfaces on the targets.

25 Claims, 3 Drawing Sheets

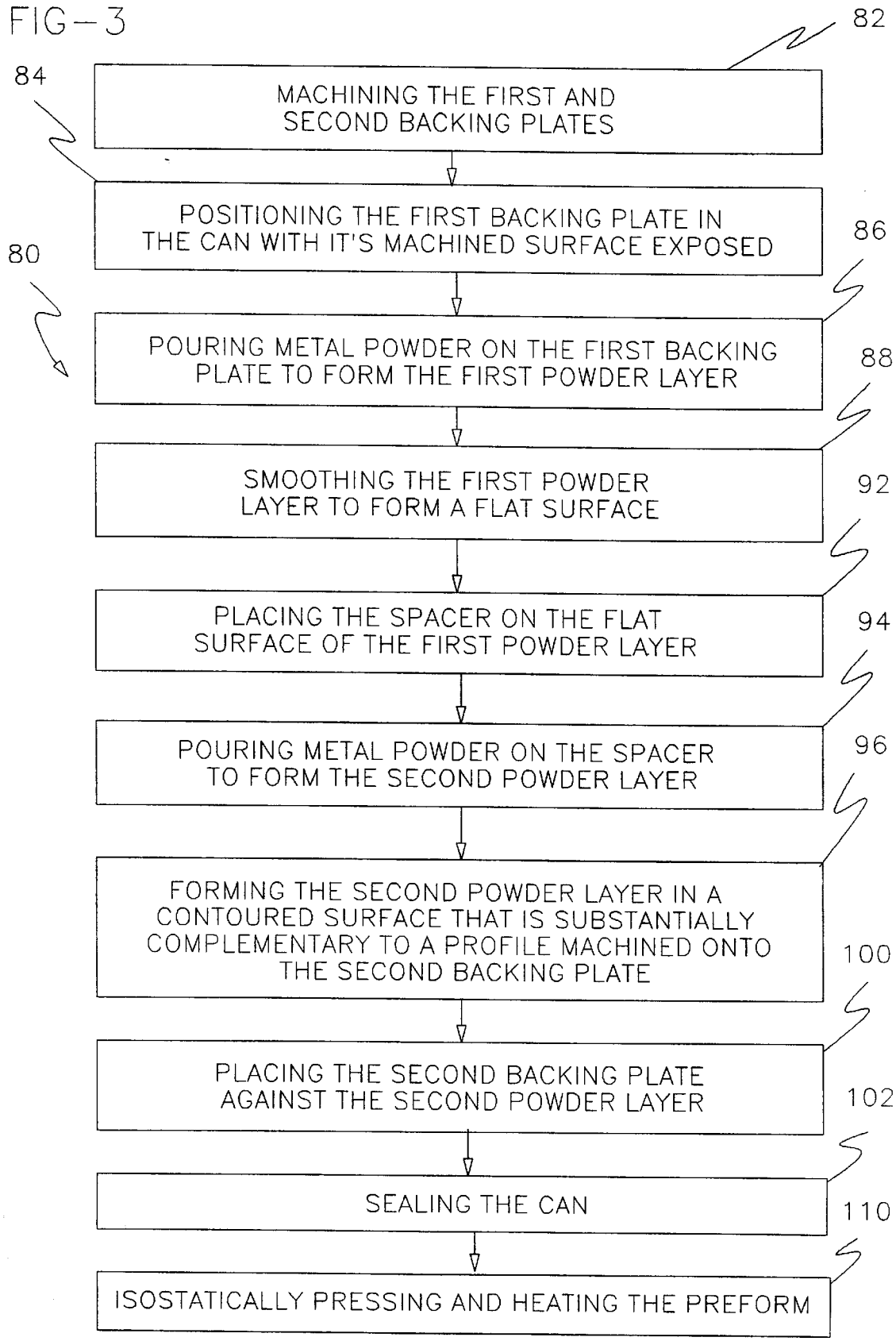

METHOD FOR PRODUCING NEAR NET SHAPE PLANAR SPUTTERING TARGETS AND AN INTERMEDIATE THEREFOR

This appln. is a 371 of PCT/US97/02060, Dec. 13, 1997.

BACKGROUND OF THE INVENTION

1. Field of the Invention

The present invention pertains to cathode sputtering apparatus, and more particularly to a method for economically producing sputtering targets by pressure consolidating powdered metal to form a target layer and simultaneously forming a diffusion bond between the target layer and a specially contoured backing plate. The target is thereby formed in a near net shape.

2. Description of the Related Art

Sputtering as a means to deposit thin films of a desired material on a substrate has become important in the manufacture of semi-conductor devices, such as integrated circuits. In a sputtering system, material to be deposited on a substrate is removed from a sputtering target by bombardment of the target with ions.

Since the sputtering process removes sputtering material from the targets, the targets have limited lives and must be replaced periodically. The removal of the material from the targets is not uniform across the exposed surfaces of the targets, and the targets, at the ends of their lives, assume "net shapes" or surface profiles characteristic of the ion source, sputtering material and target shape used. These net shapes typically consist of concentric furrows or "sputtering tracks." Unfortunately, the spent or used targets contain relatively large quantities of expensive, unused target materials. Therefore, it has been proposed to form targets having "near net shapes" to minimize the amount of unused sputtering material left at the end of the target's useful life.

Currently available sputtering targets include a backing plate member attached to the target underside. The backing plate members are typically formed from a less expensive material than the target. Most often, a cooling medium is circulated in heat exchange relationship with the target and its accompanying backing plate to dissipate target heating that results from the sputtering process.

In some sputtering targets, the target is physically soldered to the backing plate. For example, tungsten-titanium targets may be soldered to a copper or austenitic (non-magnetic) stainless steel backing plate using indium, tin-indium or tin-silver alloy. Alternatively, a sputtered or electroplated metallic film may be applied to an interfacial surface or surfaces of either or both the target and the backing plate to enhance the wettability of the bond surfaces being joined by the solder connection. In some cases a silver filled epoxy is used as the bonding agent.

If the sputtering system is operated at high power levels, there is the danger that the solder joint between the sputtering material and the backing plate may melt or deteriorate due to excessive heating of the target/backing plate assembly. Cracking or other failure of the sputtering target in this manner results in needless downtime of the equipment. Accordingly, there is a need to provide for a durable target/backing plate bond so that the backing plate may maintain adequate surface contact with the target to ensure proper heat exchange from the target to the cooling medium. If a suitable solder bond is not formed, the target will be limited to low power applications.

In some target assemblies using tungsten-titanium sputtering material, the deformation of the target assembly is minimized by incorporating a backing plate made of titanium which has a thermal expansion rate that is closely matched to that of the sputtering material. It is extremely difficult to produce a reliable solder bond with the titanium backing plate, however, because of the non-wetting characteristics of titanium.

Boys, U.S. Pat. No. 5,215,639, proposes composite sputtering target structures in which the sputtering material has a profiled, curvilinear, back surface conforming in shape to the eroded target surface at end-of-life. A backing plate is bonded to the sputtering target for support; the backing plate having a bonded surface complementary to the end-of-life shape of the sputtering target and designed to mate therewith. In one disclosed alternative, the sputtering material is provided in powder form and the backing plate and target are joined by compression bonding, preferably isostatic pressing.

It is desirable to form a flat, even surface on the finished sputtering target. Indeed, the precision with which the near net shape of the target is realized depends on the evenness of the initial exposed surface. It has been found that sputtering surfaces formed on targets produced by methods such as Boys' are often marred by defects such as concentric depressions corresponding to the sputtering rings of the near net profiles on the surfaces of the backing plates. Accordingly, targets produced by methods such as Boys' may require an unnecessary amount of additional machining to produce a desired shape. Therefore, there remains a need in the art for a method for efficiently producing sputtering targets with uniformly even sputtering surfaces.

SUMMARY OF THE INVENTION

These and other objects are met by the method for producing near net shape sputtering targets disclosed herein.

Briefly, the method comprises the production of sputtering targets from metal powder consolidated by means of heat and pressure to form sputtering material which is simultaneously bonded to backing plates. In preferred form, the method includes the step of machining first and second metal backing plates to form a first machined surface on the first backing plate and a second machined surface on the second backing plate. In an especially preferred method, the first and second machined surfaces have substantially identical profiles; each corresponding to a near net shape configuration of a sputter target.

An intermediate or preform is constructed in a can which is then used in consolidating the metal powder and bonding the sputtering material to the backing plates. The first backing plate is positioned in the can with the first machined surface exposed and the opposite backing plate surface adjacent the bottom of the can. A first metal powder is poured on the first backing plate to form a first powder layer, and the first powder layer is smoothed to form a flat surface superposed over the first machined surface. A spacer is placed on top of the flat surface formed from the first powder layer. A second metal powder is poured on the side of the spacer opposite from the first powder layer to form a second powder layer, and the second powder layer is placed and shaped over the spacer to form a powder surface on top of the spacer having a powder surface profile complementary to the profile of the second machined surface. The second backing plate is placed against the second powder layer with the second machined surface facing the powder surface.

The can is sealed, and the preform is heated and isostatically pressed. In the process, the first and second powder layers are preferably consolidated to form first and second consolidated layers, while the first and second consolidated layers are bonded simultaneously to the first and second backing plates respectively. After the pressure consolidation step, the can is removed and the first target/backing plate combination is separated from the second target/backing plate combination.

When practiced using backing plates or powder layers having different geometries or compositions, the method promotes efficiency and minimizes waste since. Unlike prior art methods such as that disclosed in Mueller, U.S. Pat. No. 5,397,050, the disclosure of which is incorporated herein by reference, more than one sputtering target/backing plate assembly may be produced in a single isostatic pressing procedure utilizing a single can.

The method is most advantageous when the compositions and geometries of the backing plates and the powder layers are substantially identical. The method uniformly produces planar sputtering surfaces which need little additional machining or the like to result in proper target shape and size. An especially preferred spacer, which comprises parallel metal plates welded together along their edges to enclose a bond-resistant material such as boron nitride, facilitates the separation of the top target/backing plate assembly from the bottom assembly.

Therefore, it is one object of the invention to provide an efficient method for producing sputtering targets, especially targets having uniformly even sputtering surfaces.

The invention will be further described in conjunction with the appended drawings and following detailed description.

BRIEF DESCRIPTION OF THE DRAWINGS

FIG. 3 is a flow chart showing the method of the present invention.

DETAILED DESCRIPTION OF THE PREFERRED EMBODIMENT

Figure 1:
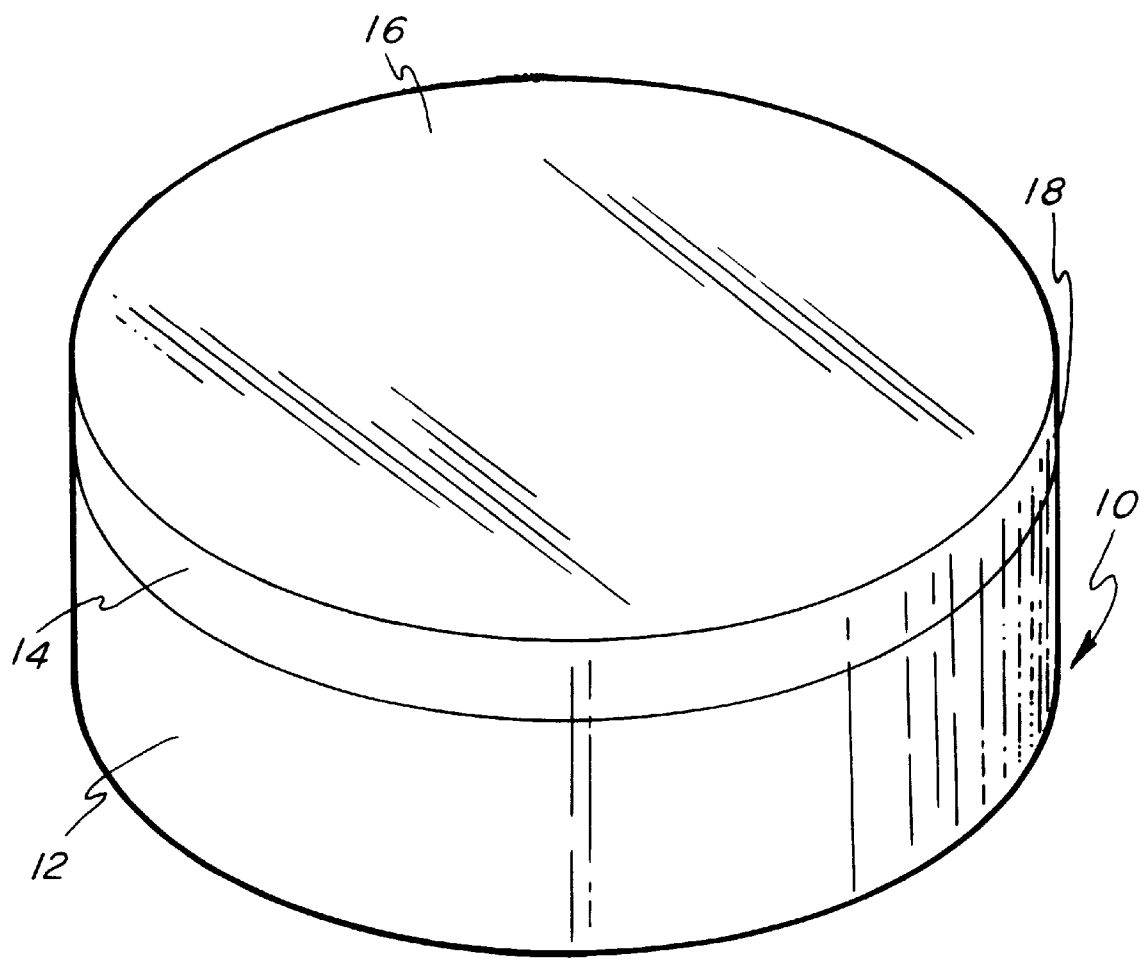
FIG. 1 is a perspective view of a sputtering target produced by the method of the invention.

Turning now to FIG. 1, there is shown one form of sputtering target/backing plate assembly 10 which can be produced by the preferred method. The assembly includes a backing plate 12, preferably composed of titanium, and a consolidated layer of sputtering material forming target 14, preferably a tungsten-titanium alloy. The assembly 10 is cylindrical in shape and has a substantially planar sputtering surface 16. While a distinct interface 18 is shown between the backing plate 12 and the target 14 in FIG. 1, the diffusion bond produced by the preferred method is likely, in practice, to produce a transitional band rather than a sharp interface between the backing plate 12 and the target 14. Together, the target 14 and backing plate 12 form a bonded assembly ready for insertion into a sputter coating system with the lower surface of the backing plate adapted for reception in and mating with the cathode in conventional cathodic sputter coating systems.

Figure 2:
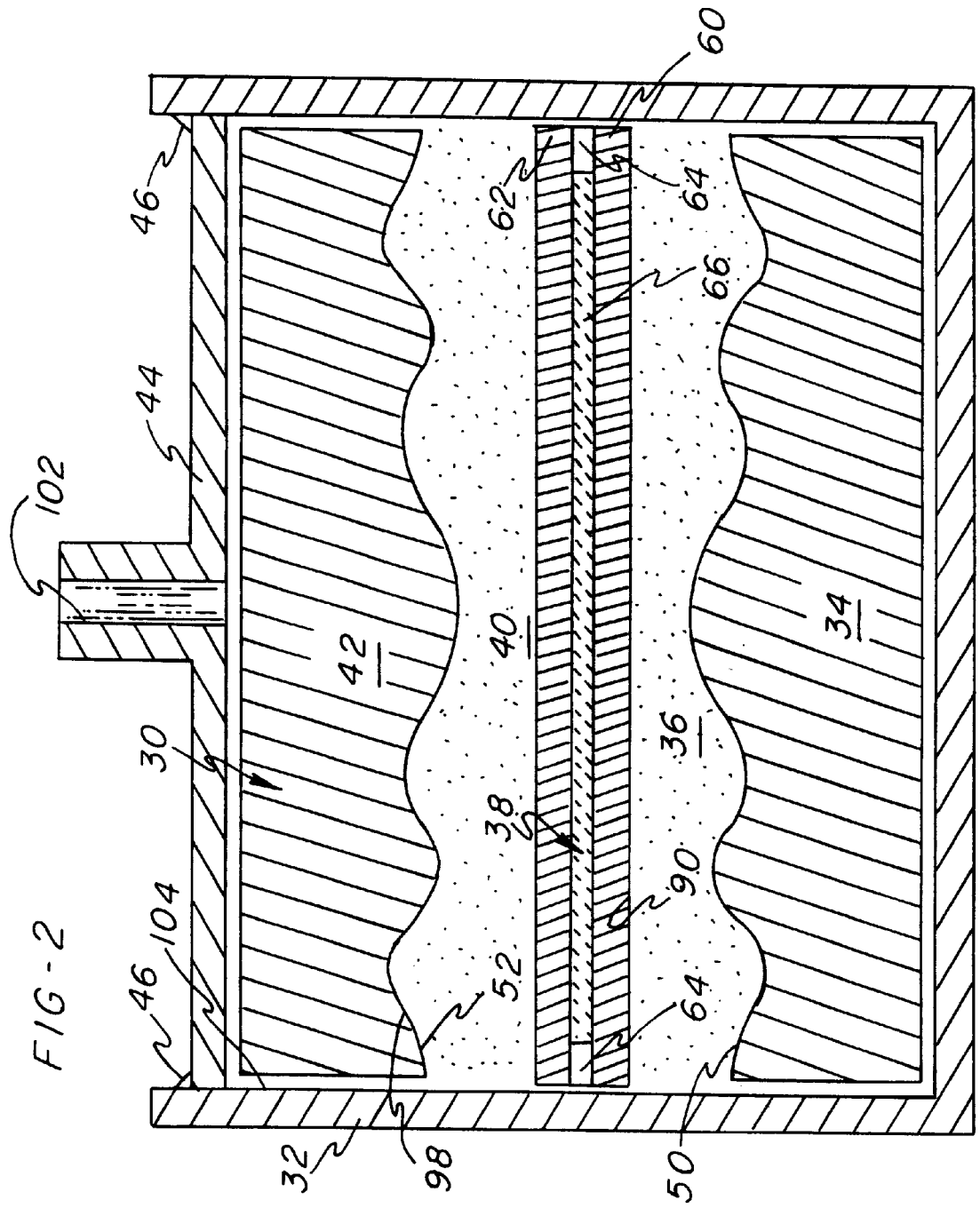
FIG. 2 is a side sectional view showing an intermediate for use in the present invention enclosed in a can for isostatic pressing.

FIG. 2 shows an intermediate or preform 30 assembled in a can 32 for use in producing the target/backing plate assembly 10 of FIG. 1. The intermediate includes a first backing plate 34, a first powder layer 36 abutting the first backing plate 34, a spacer 38 abutting the first powder layer 36 opposite the first backing plate 34, a second powder layer 40 abutting the spacer 38 opposite the first powder layer 36 and a second backing plate 42 abutting the second powder layer 40 opposite the spacer 38. The can 32 in which the intermediate 30 is assembled is sealed by means of a lid 44 welded to the can 32 as at 46.

The first and second backing plates 34, 42 each preferably comprise titanium. The first backing plate 34 has a first contoured surface 50 facing the first powder layer 36 and the second backing plate 42 has a second contoured surface 52 facing the second powder layer 40. The surfaces 50 and 52 can be appropriately shaped or profiled by machining or other similar operations. According to an especially preferred method, the first and second contoured surfaces 50, 52 have substantially identical profiles with each corresponding to a near net shape configuration of a desired target. Such near net shapes are determinable by means of reasonable experimentation according to methods generally known to those of ordinary skill in the art.

The first and second powder layers 36, 40 each preferably comprise a mixture of titanium and tungsten powders. In an especially preferred form, the compositions and geometries of the backing plates 34, 42 are the same and the compositions and shape of powder layers 36, 40 are substantially identical to thereby form a symmetrical assembly in the can 32.

A spacer includes two parallel steel plates 60, 62 welded along their edges, as at 64. A bond-resistant material 66 capable of withstanding heating and compression, such as boron nitride, is enclosed between the plates 60, 62. The weld 64 must be sufficiently continuous and strong to prevent the bond-resistant material 66 from contaminating the adjacent powder layers 36, 40. The spacer separates the top target/backing plate combination from the bottom target/backing plate combination.

FIG. 3 is a flow chart setting forth a preferred method 80 for producing a sputtering target 10 (FIG. 1). The preferred method begins with the step 82 of machining first and second metal backing plates 34, 42 (FIG. 2) to form the first contoured surface 50 (FIG. 2) on the first backing plate 34 (FIG. 2) and the second contoured surface 52 (FIG. 2) on the second backing plate 42 (FIG. 2). In step 84, the first backing plate 34 (FIG. 2) is positioned in the can 32 (FIG. 2) with the first contoured surface 50 (FIG. 2) exposed and with the opposing bottom surface of the backing plate adjacent the bottom of the can. In step 86 a first metal powder (not shown), preferably a mixture of titanium and tungsten powders, is measured and poured onto the first backing plate 34 (FIG. 2) to form the first powder layer 36 FIG. 2). In step 88 the first powder layer 36 (FIG. 2) is smoothed to form a flat surface 90 (FIG. 2) superposed over the first contoured surface 50 (FIG. 2) using a spreading tool (not shown) in a manner generally known to those of ordinary skill in the art. In step 92 the spacer 38 (FIG. 2) is placed on top of this flat surface 90 (FIG. 2) formed by the first powder layer 36 (FIG. 2).

In step 94 a carefully measured quantity of second metal powder, substantially corresponding to the weight of the near net shape target to be formed thereby and preferably of the same composition as the first metal powder, is measured and poured onto the spacer 38 (FIG. 2) to form the second powder layer 40 (FIG. 2). In step 96 the second powder layer 40 (FIG. 2) is shaped using a comb-like spreading tool (not shown) in a manner generally known to those of ordinary skill in the art to form a powder surface 98 (FIG. 2) opposite the spacer 38 (FIG. 2) having a powder surface profile complementary to the profile of the second contoured surface 52 FIG. 2). In step 100, the second backing plate 42 (FIG. 2) is placed against the second powder layer 40 (FIG. 2) with the second contoured surface 52 (FIG. 2) facing the powder surface 96 (FIG. 2). In step 102, the can 32 (FIG. 2) is sealed by welding the lid 44 (FIG. 2) over an opening 104 (FIG. 2) in the can 32. Optionally, the intermediate 30 is compressed by means of a pressing punch (not shown) inserted through the opening 104 prior to the sealing step 102.

In step 110 on the flow chart of FIG. 3, the intermediate 30 (FIG. 2) is heated and isostatically pressed (HIPed). Other pressure consolidation techniques such as cold isostatic pressing and consolidated atmospheric pressure processes could also be employed. According to an especially preferred process, the first and second powder layers 36, 40 (FIG. 3) are preferably HIP consolidated to form first and second consolidated layers such as that corresponding to target 14 (FIG. 1), while the first and second consolidated layers are bonded simultaneously to the first and second backing plates 34, 42 (FIG. 3). The particular conditions used for the hot isostatic pressing process are selected to meet the sputtering material requirements as well as to achieve a durable bond between the consolidated layers (not shown) and the backing plates 34, 42 (FIG. 2).

Briefly stated, the hot isostatic pressing process includes evacuating an interior of the can 32 (if necessary) through a tap 102, heating the can 32 to a selected temperature under a predetermined pressure in an autoclave. After HIPing, the assembly may be subjected to a further heating step and further compacted in a platen press to press the can assembly to the desired flatness. This post HIPing compaction step is described in aforementioned U.S. Pat. No. 5,397,050. Typical HIP pressing conditions for titanium-tungsten sputtering targets include temperatures on the order of 800–1000° C. and pressures on the order of 15,000–30,000 psi over a period on the order of four hours. The hot isostatic pressing process is generally known among those of ordinary skill in the art and is discussed in more detail in Mueller, U.S. Pat. No. 5,397,050 and Wickersham et al., U.S. Pat. No. 5,234,487, the disclosures of which are incorporated herein by reference.

When the heating and isostatically pressing step 110 is completed, the can 32 is cut and the top and bottom target/backing plate assemblies are removed and separated from each other resulting in a first target/bonded backing plate combination and a second target/bonded backing plate combination. Preferably, the can 32 is formed from a bond-resistant material which facilitates the removal of the formed sputtering targets. The structure of the preferred spacer 38 (FIG. 2) likewise promotes the separation of the formed targets. After the target/backing plate assemblies are removed from the can and separated from each other, they are optionally machined as required to provide the desired finished shape.

Turning again to FIG. 2, as a result of the above process, a pair of sputter targets is produced simultaneously with the step of bonding each of the targets to its associated backing plate. The target/backing plate bonds formed along the respective first and second contoured surfaces 50, 52 are of the diffusion type which provides greater strength and allows for higher sputter operation temperatures than many other bonding techniques.

Based upon preliminary observations, in those instances in which identical backing plate surfaces 50, 52 are provided with the measured amounts of powdered materials 36, 40 being substantially the same, a symmetrical assembly is formed within the can 32 ready for HIPing. After HIPing and separation of the first target/backing plate assembly from the second target/backing plate assembly, it can be observed that the top side, sputter surfaces presented by both of the targets is quite flat, with little or no tendency to form concavities or furrows of the type that have been experienced in practice of the methods reported in U.S. Pat. No. 5,215,639.

Additionally, although the invention has been described in terms of simultaneously providing a pair of W, Ti/Ti target/backing plate assemblies, the methods can be used also to provide for example the following assemblies:

| Target | Backing Plate |
|---|---|
| Al and/or Ta | Al or Al alloy |
| Ti and/or Al | Al or Al alloy |

Also, although a spacer is shown separating the top and bottom assemblies in the HIP can, the spacer can be omitted with the first and second powder layers 36, 38 (FIG. 2) existing in a unitary, combined mass interposed between the first and second contoured surfaces 50, 52. In this case, after HIPing or other pressure consolidation, the entire mass including the backing plates 34,42 and combined mass of consolidated powder intermediate the backing plates, is removed from the can. A laser, electron beam, or other cutting tool can then be used to cut the assembly along a horizontal axis (relative to the structure shown in FIG. 2) to separate the mass into a first and second assemblies with each target being diffusion bonding to its underlying backing plate.

While the forms of apparatus herein described constitute preferred embodiments of the invention, it should be understood that the invention is not limited to these precise forms of apparatus, and that changes may be made therein without departing from the scope of the invention, which is defined in the appended claims. For example, the compositions of the sputtering material and the backing plates are not critical to the invention. Likewise, while the preferred means of consolidating the powder layers and bonding the sputtering material to the backing plates has been identified to be hot isostatic pressing, it is within the contemplation of the invention to use other consolidating techniques, with or without assembly of the intermediate in a can or other support.

I claim:

1. A method for producing a first sputter target and a second sputter target and a first backing plate and a second backing plate wherein said first target is diffusion bonded to said first backing plate and said second target is diffusion bonded to said second backing plate, said method comprising:

providing a first backing plate having an upper surface;

providing a first layer of metal powder adapted to form said first target and placing said first layer over said upper surface of said first backing plate;

providing a second layer of metal powder adapted to form said second target and placing said second layer of metal powder adjacent said first layer of metal powder to thereby define an interfacial boundary between said first layer of metal powder and said second layer of metal powder;

providing a second backing plate having an exposed surface superposing said second backing plate over said second layer of metal powder with said backing plate surface contiguous with said second layer of metal powder to form a combined assembly comprising a layered arrangement of said first backing plate, first layer of metal powder, second layer of metal powder, and said second backing plate;

pressure consolidating said combined assembly to simultaneously form a diffusion bond between said first backing plate and said first layer of powder and a diffusion bond between said second backing plate and said second layer of powder; and subsequently;

separating said combined assembly along said interfacial boundary.

2. A method as recited in claim 1 wherein said upper surface of said first backing plate and said surface of said second backing plate have identical contoured surfaces.

3. A method as recited in claim 2 wherein said first and second layers of powdered metals are a blend of tungsten and titanium metals.

4. A method as recited in claim 3 wherein said first and second backing plates are composed of titanium.

5. A method as recited in claim 4 wherein said step of pressure consolidating comprises hot isostatic pressing (HIP).

6. A method as recited in claim 5 wherein said hot isostatic pressing comprises pressing said assembly at temperatures of about 800° C.–1000° C. and pressure of about 15,000–30,000 psi.

7. A method for producing sputtering targets comprising the steps of:

constructing a preform including a first backing plate, a first powder layer abutting against said first backing plate, a spacer abutting against said first powder layer opposite said first backing plate, a second powder layer abutting against said spacer opposite said first powder layer, and a second backing plate abutting against said second powder layer opposite said spacer; and pressure consolidating said first and second powder layers to form first and second consolidated layers, and simultaneously bonding said first and second consolidated layers to said first and second backing plates.

8. The method as recited in claim 7 including the step of forming an uneven surface on one of said first and second backing plates, wherein the step of constructing said preform includes constructing said preform such that said uneven surface faces one of said first and second powder layers.

9. The method as recited in claim 8 wherein the step of forming said uneven surface on said one of said first and second backing plates includes machining said one of said first and second backing plates.

10. The method as recited in claim 8 wherein the step of forming said uneven surface on said one of said first and second backing plates includes forming said uneven surface including concentric grooves corresponding to sputter tracks generated by an ion source.

11. The method as recited in claim 7, wherein the step of constructing said preform includes the steps of positioning said first backing plate in a can, forming said first powder layer against said first backing plate in said can, placing said spacer against said first powder layer, forming said second powder layer against said spacer, placing said second backing plate against said second powder layer, and sealing said can.

12. The method as recited in claim 11, including the additional step of forming an uneven surface on one of said first and second backing plates.

13. The method as recited in claim 11 wherein the step of forming said first powder layer includes the steps of pouring powder on said first backing plate and smoothing a surface of said powder.

14. The method as recited in claim 11, wherein the step of forming the second powder layer includes the step of pouring powder on said spacer and forming powder surface on said powder having a profile complementary to sputter tracks generated by an ion source.

15. The method as recited in claim 7 wherein the step of pressure consolidating said first and second powder layers to form first and second consolidated layers and simultaneously bonding said first and second consolidated layers to said first and second backing plates includes isostatically compressing said preform.

16. The method as recited in claim 15 wherein the step of isostatically compressing said preform includes heating said preform.

17. An assembly useful in the production of sputtering targets comprising:

a first backing plate;

a first powder layer abutting said first backing plate;

a spacer abutting said first powder layer opposite said first backing plate;

a second powder layer abutting said spacer opposite said first powder layer; and a second backing plate abutting said second powder layer opposite said spacer.

18. The assembly as recited in claim 17 wherein one of said first and second backing plates abuts one of said first and second powder layers along an uneven surface.

19. The assembly as recited in claim 18 wherein said uneven surface includes concentric grooves corresponding to sputter tracks generated by an ion source.

20. The assembly as recited in claim 17 further comprising, in combination, a can, wherein said assembly is positioned in said can.

21. The assembly as recited in claim 17 wherein said spacer is formed from metal sheets separated by a layer of bond-resistant material.

22. The assembly as recited in claim 15 wherein said bond-resistant material comprises boron nitride.

23. A method for producing sputtering targets comprising the steps of machining first and second metal backing plates to form a first machined surface having a first profile corresponding to a near net profile of a first ion source on said first backing plate and a second machined surface having a first profile corresponding to a near net profile of a second ion source on said second backing plate;

positioning said first backing plate in a can with said first machined surface exposed;

pouring a first metal powder on said first backing plate to form a first powder layer;

smoothing said first powder layer to form a flat surface opposite said first machined surface;

placing a spacer on said flat surface;

pouring a second metal powder on said spacer to form a second powder layer;

arranging said second powder layer to form a powder surface opposite said spacer having a powder surface profile complementary to said second profile;

placing said second backing plate against said second powder layer with said second machined surface facing said powder surface;

sealing said can; and isostatically pressing said first and second backing surfaces and first and second powder layers to consolidate said first and second powder layers to form first and second consolidated layers, and to simultaneously bond said first and second consolidated layers to said first and second backing plates.

24. The method as recited in claim 23 wherein said first and second backing layers are substantially identical in composition, said first and second metal powders are substantially identical in composition, and said first and second profiles are substantially identical.

25. The method as recited in claim 24 including the additional step of forming said spacer by welding two metal plates along edges of said two metal plates to enclose a bond-resistant agent between said two metal plates.

* * * * *